United States Patent
Murphy

[11] 3,978,578
[45] Sept. 7, 1976

[54] METHOD FOR PACKAGING SEMICONDUCTOR DEVICES

[75] Inventor: James C. Murphy, Cupertino, Calif.

[73] Assignee: Fairchild Camera and Instrument Corporation, Mountain View, Calif.

[22] Filed: Aug. 29, 1974

[21] Appl. No.: 501,577

[52] U.S. Cl. .................................. 29/577; 29/580; 29/588; 29/590; 427/82; 427/240; 427/385
[51] Int. Cl.² .................................................. B01J 17/00
[58] Field of Search ............ 29/580, 577, 583, 588, 29/589, 590; 427/82, 385, 240

[56] References Cited
UNITED STATES PATENTS

| | | | |
|---|---|---|---|
| 3,478,420 | 11/1969 | Grimes et al. .................. | 29/588 |
| 3,496,631 | 2/1970 | Chen ............................. | 29/577 |
| 3,584,264 | 6/1971 | Melouski et al. .............. | 29/589 |
| 3,610,870 | 10/1971 | Sakamoto ...................... | 29/588 X |
| 3,706,840 | 12/1972 | Moyle et al. .................. | 29/588 X |
| 3,708,870 | 1/1973 | Goodman ....................... | 29/588 X |
| 3,762,039 | 10/1973 | Douglass et al. .............. | 29/588 |
| 3,903,590 | 9/1975 | Yokogawa ...................... | 29/589 |

FOREIGN PATENTS OR APPLICATIONS 2,032,009  11/1970  France .................. 427/82

Primary Examiner—W. Tupman
Attorney, Agent, or Firm—Alan H. MacPherson; Henry K. Woodward; J. Ronald Richbourg

[57] ABSTRACT

An improved method of packaging semiconductor devices and dice which comprises coating a semiconductor wafer with a polyimide film, etching selected areas of the polyimide film from the surface of the wafer, separating the wafer into a plurality of semiconductor dice wherein each of the dice have electrical contacts to circuits within the device and making ohmic electrical connection with the electrical contacts on the dice.

5 Claims, 6 Drawing Figures

METHOD FOR PACKAGING SEMICONDUCTOR DEVICES

BACKGROUND OF THE INVENTION

1. Field of the Invention:

This invention relates to an improved method of packaging semiconductor devices, and in particular to a method of protecting semiconductor dice.

2. Prior Art:

Semiconductor wafers are segmented into a plurality of semiconductor dice, and normally each die is bonded to a lead pattern prior to packaging and testing. That is, a semiconductor die is placed onto a paddle disposed in the center of a lead frame or lead pattern, and contacts on the die are electrically connected to the individual leads of the lead patterns by means of bonding wires. Subsequently, the die with the bonding wires and lead pattern is encapsulated.

Prior to this, the surface of the semiconductor die has remained relatively unprotected during the steps of handling, packaging and testing. The surface of a semiconductor die containing an integrated circuit is sensitive to scratches which may occur during handling of the die. Also, exposure to moisture is deleterious to the surface of the die and function of the semiconductor device.

Lead frames used in the past have included a paddle for mounting the semiconductor die as well as the plurality of electrical leads of the frame disposed for connection to contacts on the die. That is, the paddle is a part of the lead frame structure. This type of lead frame structure makes it difficult to increase the thickness of the paddle without increasing the thickness of the leads. An increased thickness of the paddle could be advantageous to help improve heat dissipation for certain types of integrated or combinations of integrated circuits. Accordingly, the method and structure of the present invention helps overcome this disadvantage by providing protected semiconductor dice which can be mounted on a paddle separate from a lead frame. Also, a die protected in accordance with the method of the present invention can be tested prior to encapsulation.

SUMMARY OF THE INVENTION

In accordance with the present invention, a method is disclosed for packaging semiconductor devices which comprises coating a semiconductor wafer with a polyimide film, etching selected areas of the polyimide film from the surface of the wafer, separating the wafer into a plurality of semiconductor dice wherein each of the dice have electrical contacts to circuits within the device, and making ohmic electrical connection with the electrical contacts on the dice.

Further, a method is disclosed for providing a protective coating over semiconductor dice comprising spinning a semiconductor wafer containing a plurality of semiconductor dice, applying a film of polyimide material on the spinning wafer, hardening the polyimide material, applying a photo-resist mask on the semiconductor wafer, and etching portions of the polyimide film exposed by openings in the photo-resist mask.

DETAILED DESCRIPTION

Figure 1:
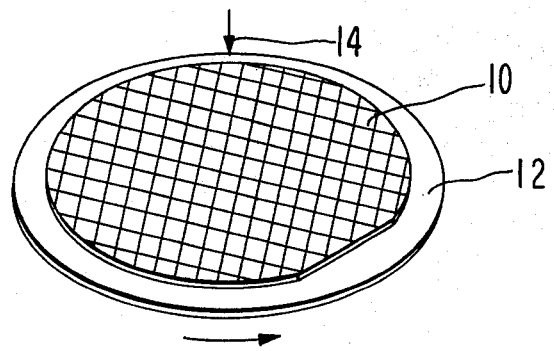
FIG. 1 is an isometric drawing which shows a semiconductor wafer mounted upon a rotating disc for coating the surface of the wafer.

Referring now to the drawings, and in particular to FIG. 1 a semiconductor wafer 10 is mounted upon a rotating disc 12. The semiconductor wafer 10 contains a multiplicity of integrated circuits generally represented by segmented sections of the wafer 10. The platform 12 is rotated at a speed within the range of 2500 rpm to 5000 rpm. A polyimide material is applied to the surface of the wafer as generally represented by the arrow 14. A preferred polyimide material is F-410 as manufactured by the Dupont Corporation of Wilmington, Delaware. The polyimide material has a preferred diultion of 4:1 in M-methyl pyralodone. This concentration, with a rotation of the disc 12 at 4000 rpm, produces a film on the surface of the wafer 10 having a thickness within the range of 0.5 to 6.0 microns.

Figure 2A:
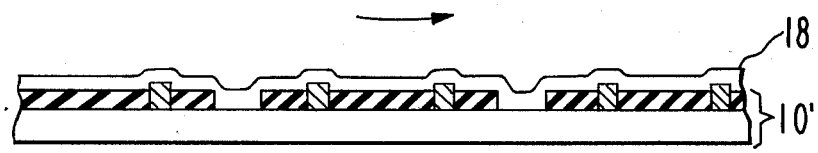
FIG. 2a shows a cross section of a wafer coated with a polyimide film.

The semiconductor wafer 10 is removed from the disc 12 and placed into a heating chamber at 100°C for 20 minutes. Nitrogen gas ($N_2$) is injected into the heating chamber during which time the wafer is heated in the chamber. Subsequently, the temperature is raised within the heating chamber to 265°C for one hour with an accompanying injection of nitrogen gas ($N_2$) into the chamber. It was discovered empirically that the presence of nitrogen gas ($N_2$) during the curing of the polyimide material inhibited unfavorable results. For example, oxidation of the metal associated with the integrated circuits within the dice was inhibited. A cross section of the resulting structure following the preceding step is illustrated in FIG. 2a. The portion of the cross section in FIG. 2a that represents the semiconductor wafer is represented by the reference numeral 10'. The polyimide film is represented by the reference numeral 18.

Figure 2B:
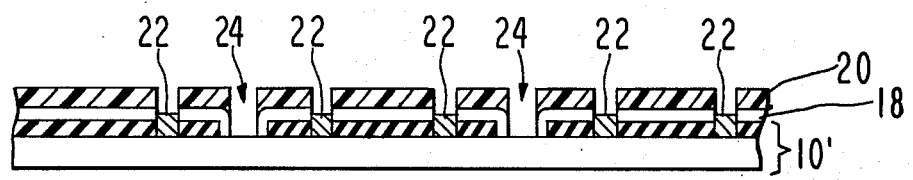
FIG. 2b shows a cross section of the semiconductor wafer after portions of the polyimide film have been etched away.

The semiconductor wafer is removed from the heating chamber and is again placed upon the rotating disc 12. At this time, a photo-resist material is applied over the polyimide film 18 in the same manner that the polyimide material was applied in the preceding step, and as generally represented by the arrow 14. A preferred photo-resist material is Kodak 752 as manufactured by Eastman Kodak Co. of Rochester, New York. However, Kodak 747 photo-resist may also be satisfactorily used. Infrared light is directed upon the photo-resist material for two to four minutes to soft bake the photo-resist material. Subsequently, the photo-resist material is aligned, exposed in a preferred pattern, and developed in a conventional manner. If Kodak 752 photo-resist is employed a 10 second exposure is required; whereas, if Kodak 747 photo-resist is used a 6 second exposure is required. The photo-resist material is developed in a solution of xylene. A cross section of the resulting structure following the above described steps is illustrated in FIG. 2b. The developed photoresist material is depicted in FIG. 2b by the reference numeral 20.

The semiconductor wafer 10 is again placed into a heating chamber to hardbake the photo-resist layer 20. If the Kodak 752 photo-resist is employed, heat at a temperature of 175°C is applied to the photo-resist layer 20 for 30 minutes; whereas, if Kodak 747 photoresist is employed heat at a temperature of 155°C is applied to the photo-resist layer 20 for one hour.

Subsequently, the portions of the underlying polyimide layer 18 are etched away in areas exposed by photo-resist layer 20. A preferred etchant is hydrazine, which etchant is applied at 47°C for 1 ½ minutes. The photo-resist mask or layer 20 defines openings over contact points 22 on the integrated circuits in the wafer 10, and the channels 24 between adjacent circuits in the wafer 10. The semiconductor wafer 10 is cleaned in a solution of isopropyl alcohol to dilute and thereby abate the chemical action of the etchant.

A silicon etchant is applied to the structure as shown in FIG. 2b, which etchant removes a portion of the underlying silicon substrate within the channels 24. This etchant, which may be any conventional silicon etchant, does not attack the exposed contact points 22. The purpose for this silicon etch is to facilitate ease of cutting the wafer 10 into a multiplicity of dice. The semiconductor wafer 10 is cleaned in a solution of isopropyl alcohol to dilute and thereby abate the chemical action of the etchant.

The semiconductor wafer 10 is cut into a multiplicity of dice, which cuts are made within the channels 24. Each of the dice assembled by the process described hereinabove are individually protected by a layer of polyimide material. The contact points 22 are not covered by the polyimide layer 18, and are employed for making an ohmic contact in testing the integrated circuit within the die.

Figure 2C:
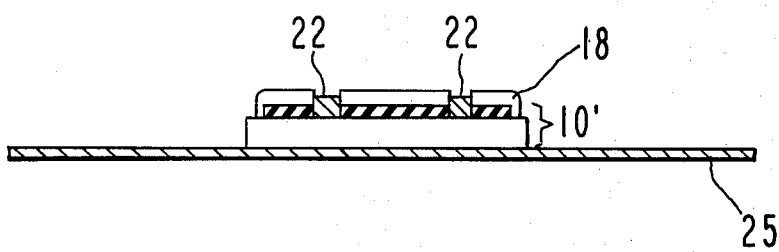
FIG. 2c shows a cross section of a semiconductor die cut from the semiconductor wafer in FIG. 2b and mounted upon a paddle.

Referring now to FIG. 2c, each of the dice are attached to a paddle structure 25 by any conventional die attach technique. The paddle may comprise a portion of a conventional semiconductor lead frame, or may consist of a single paddle. Once the die has been attached to the paddle, the die may be tested by means of the contacts 22 prior to packaging.

Figure 2D:
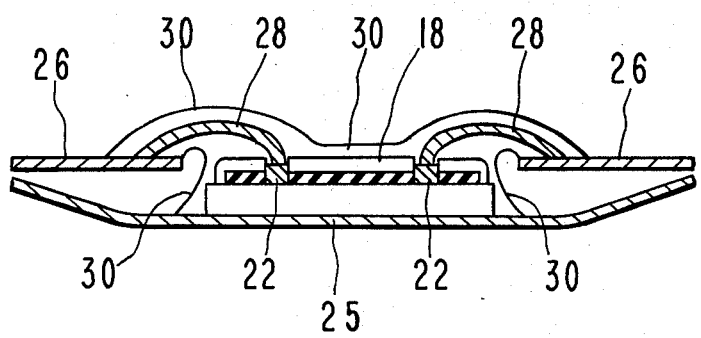
FIG. 2d shows a cross section of a semiconductor die bonded to a lead frame and coated with a second polyimide film.

Referring now to FIG. 2d, the individual paddle 25 containing a single die is aligned with a lead frame 26 and the contacts 22 are electrically connected to a lead frame by means of bonding wires 28.

A second film 30 of polyimide material is deposited onto the semiconductor die, the bonding wires, and adjacent portions of the lead frame. This additional coating of polyimide material helps prevent electrical shorts and adds strength to the bonding wires. The lead frame 26 and the paddle 25 containing the die, which is electrically connected to the lead frame, is encapsulated in a conventional manner.

Figure 3:
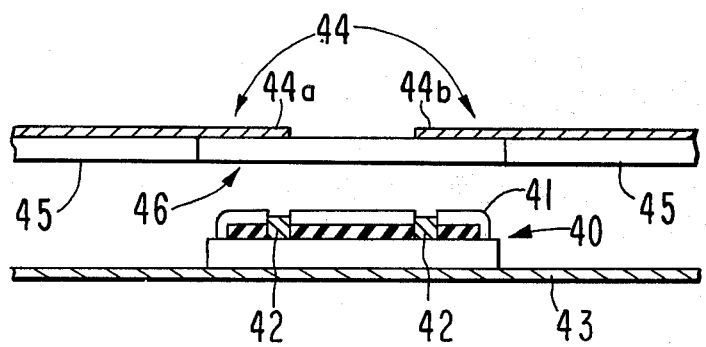
FIG. 3 shows a cross section of a semiconductor die with an alternate type of lead frame.

FIG. 3 illustrates a semiconductor die 40 coated with a polyimide film 41 in accordance with the principles of the present invention. Contacts 42 are provided for effecting electrical connection to the circuits (not shown) within the die 40. The die 40 is affixed to a paddle 43 by conventional die-attach techniques. A lead frame 44, which is supported by a film 45 of an insulating material, is aligned above the die 40. The lead portions 44a and 44b of the lead frame 44 extend in cantilever fashion over an opening (generally referred to by reference numeral 46) within the film 44. The die 40 and supporting paddle 43 are brought into contact with the lead portions 44a and 44b, and the contacts 42 are bonded to the lead portions 44a and 44b in a conventional manner. Accordingly, it may be seen that the layer of polyimide film 41, which film layer is insulative, prevents short circuits which may be caused by the lead portions 44a and 44b coming in contact with edges of the die 40.

I claim:

1. A method for packaging semiconductor devices comprising the steps of:
   a. spinning on a rotating platform a semiconductor wafer containing a multiplicity of integrated circuit die;
   b. applying a polyimide material on said spinning wafer thereby providing a film of said polyimide material on the surface of each of said die;
   c. hardening said polyimide film by heating said wafer at a first elevated temperature in a nitrogen atmosphere and then at a second higher elevated temperature in a nitrogen atmosphere;
   d. etching selected areas of said polyimide film from the surface of said wafer, thereby exposing electrical circuit contact areas on each of said die;
   e. separating said multiplicity of integrated circuit die from said wafer;
   f. attaching each of said multiplicity of die to a support means;
   g. electrically coupling said current contact areas on each of said die to electrical conductors by means of bonding wires; and,
   h. coating each of said die and said electrical conductors with a second polyimide film, thereby adding strength to said bonding wires.

2. The method as in claim 1 further characterized by said polyimide material having a preferred dilution of 4:1 in N-methyl pyralodone.

3. The method as in claim 2 wherein said spinning step comprises rotating said platform at a speed of 2500 to 5000 RPM such that said film is coated on said wafer at a thickness within the range of 0.5 to 6.0 microns.

4. A method as defined in claim 1 further characterized by encapsulating said dice coupled to said electrical conductors in a protective housing.

5. The method defined by claim 1 wherein said wafer is first heated at approximately 100° C. for approximately twenty minutes and then heated at approximately 265°C. for approximately one hour.

* * * * *